United States Patent
Pietambaram et al.

(10) Patent No.: US 9,947,631 B2
(45) Date of Patent: Apr. 17, 2018

(54) SURFACE FINISHES FOR INTERCONNECTION PADS IN MICROELECTRONIC STRUCTURES

(71) Applicant: INTEL CORPORATION, Santa Clara, CA (US)

(72) Inventors: Srinivas V. Pietambaram, Gilbert, AZ (US); Kyu-Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 159 days.

(21) Appl. No.: 14/882,780

(22) Filed: Oct. 14, 2015

(65) Prior Publication Data

US 2017/0110422 A1   Apr. 20, 2017

(51) Int. Cl.
| | |
|---|---|
| *H01L 23/00* | (2006.01) |
| *B23K 35/30* | (2006.01) |
| *C22C 19/03* | (2006.01) |
| *H05K 1/11* | (2006.01) |
| *H05K 1/18* | (2006.01) |

(52) U.S. Cl.
CPC .......... *H01L 24/05* (2013.01); *B23K 35/3013* (2013.01); *B23K 35/3033* (2013.01); *C22C 19/03* (2013.01); *H01L 24/03* (2013.01); *H01L 24/13* (2013.01); *H05K 1/111* (2013.01); *H05K 1/18* (2013.01); *H01L 2224/0401* (2013.01); *H01L 2224/05083* (2013.01); *H01L 2224/05144* (2013.01); *H01L 2224/05164* (2013.01); *H01L 2224/05184* (2013.01); *H01L 2924/014* (2013.01)

(58) Field of Classification Search
CPC . H01L 24/05; B23K 35/3013; B23K 35/3033; C22C 19/03
See application file for complete search history.

(56) References Cited

U.S. PATENT DOCUMENTS

| | | | |
|---|---|---|---|
| 2003/0001275 A1* | 1/2003 | Sambucetti | ....... H01L 23/53238 257/762 |
| 2003/0107137 A1* | 6/2003 | Stierman | ............... B81B 7/0006 257/763 |
| 2006/0205234 A1 | 9/2006 | Zhong et al. | |
| 2008/0073795 A1* | 3/2008 | Kohl | ....................... H01L 24/10 257/774 |
| 2009/0236756 A1 | 9/2009 | Kim et al. | |
| 2012/0028458 A1* | 2/2012 | Cabral, Jr. | .......... H01L 23/3192 438/623 |
| 2012/0044652 A1 | 2/2012 | Horikawa et al. | |

OTHER PUBLICATIONS

Haseeb, et al.,"Interfacial Reactions Between Sn—3.5 Ag Solder and Ni—W alloy Films", Journal of Materials Science: Materials in Electronics, vol. 22, Issue 9, Feb. 13, 2011, pp. 1372-1377.
International Search Report and Written Opinion received for PCT Application No. PCT/US2016/051257, dated Dec. 19, 2016, 11 pages.

* cited by examiner

*Primary Examiner* — Margaret G Moore
(74) *Attorney, Agent, or Firm* — Green, Howard & Mughal LLP.

(57) ABSTRACT

A surface finish may be formed in a microelectronic structure, wherein the surface finish may include an interlayer comprising a refractory metal, phosphorus, and nickel, with the refractory metal having a content of between about 2 and 12% by weight and the phosphorus having a content of between about 2 and 12% by weight with the remainder being nickel. In one embodiment, the refractory metal of the interlayer may consist of one of tungsten, molybdenum, and ruthenium. In another embodiment, the interlayer may comprise the refractory metal being tungsten having a content of between about 5 and 6% by weight and phosphorus having a content of between about 5 and 6% by weight with the remainder being nickel.

15 Claims, 4 Drawing Sheets

SURFACE FINISHES FOR INTERCONNECTION PADS IN MICROELECTRONIC STRUCTURES

TECHNICAL FIELD

Embodiments of the present description generally relate to the field of microelectronic device fabrication, and, more particularly, to surface finishes formed on interconnection pads for the electrical attachment of microelectronic components with solder interconnects.

BACKGROUND

Microelectronic devices are generally fabricated from various microelectronic components, including, but not limited to, at least one microelectronic die (such as a microprocessor, a chipset, a graphics device, a wireless device, a memory device, an application specific integrated circuit, or the like), at least one passive component (such as resistors, capacitors, inductors and the like), and at least one microelectronic substrate (such as interposers, motherboards, and the like) for mounting the components. The various microelectronic components may be electrically interconnected to one another through solder interconnects extending between interconnection pads on one microelectronic component to interconnection pads on another microelectronic component.

The microelectronic industry is continually striving to produce ever faster and smaller microelectronic devices for use in various electronic products, including, but not limited to portable products, such as portable computers, digital cameras, electronic tablets, cellular phones, and the like. As the size of the microelectronic components, such as microelectronic devices and microelectronic substrates, are reduced, the current densities of the microelectronic components increases, as will be understood to those skilled in the art. As these current densities increase, surface finishes, which are disposed between interconnection pads and the solder interconnects, must not only form a ductile interconnection or "joint" between interconnection pads and the solder interconnects, but also have sufficiently strong electro-migration resistance to meet maximum current ($I_{max}$) demands of the smaller microelectronic components. Therefore, there is a need to develop surface finishes and methods of fabrication thereof that can provide a desired maximum current ($I_{max}$) while maintaining a ductile joint between interconnection pads and the solder interconnects.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
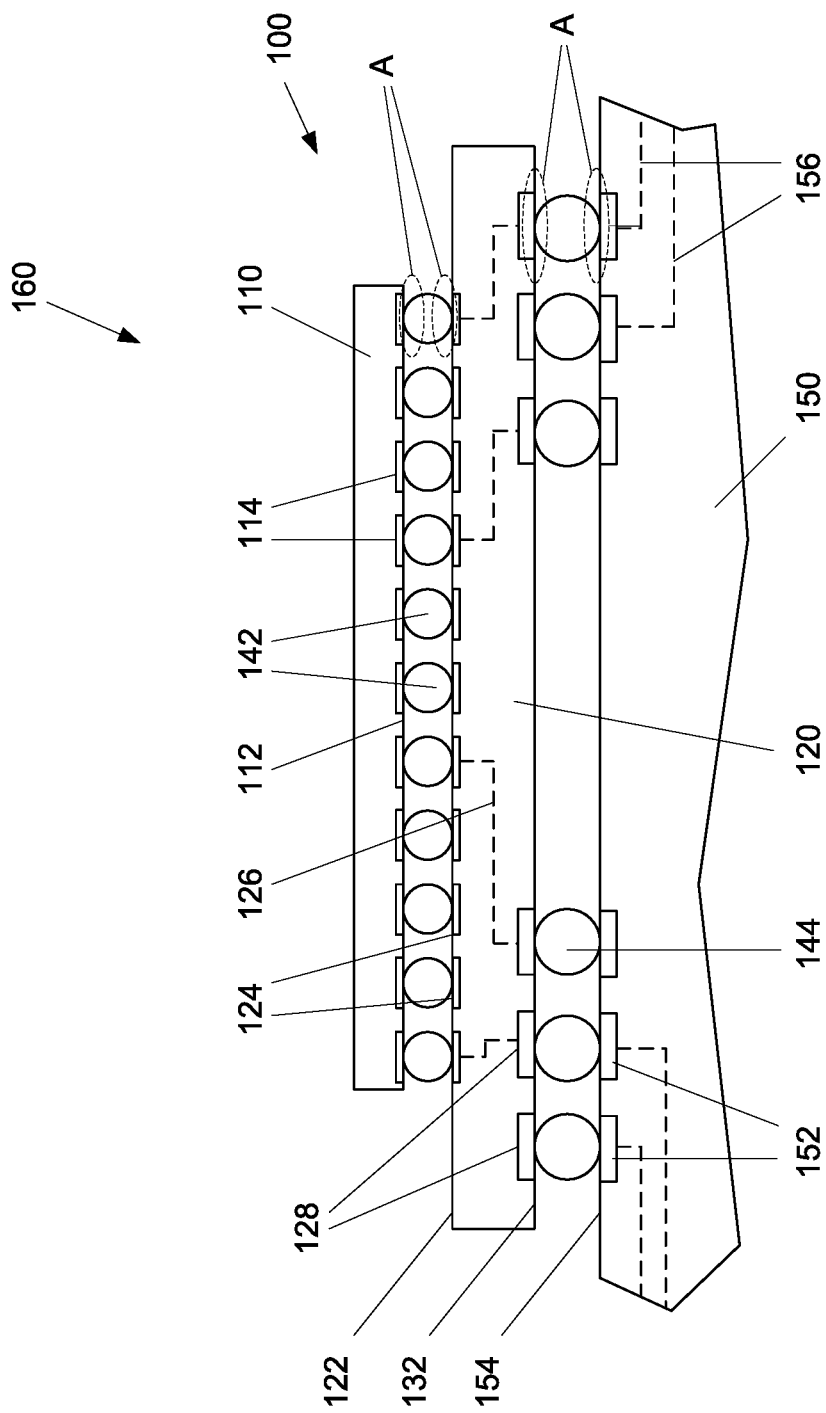
FIG. 1 is a side cross sectional view of a microelectronic structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In the production of microelectronic structures, microelectronic packages are generally mounted on microelectronic board/substrates that provide electrical communication routes between the microelectronic packages and external components. As shown in FIG. 1, a microelectronic package 100 may comprise a microelectronic device 110, such as a microprocessor, a chipset, a graphics device, a wireless device, a memory device, an application specific integrated circuit, or the like, attached to a first surface 122 of a microelectronic interposer/substrate 120 through a plurality of solder interconnects 142 in a configuration generally known as a flip-chip or controlled collapse chip connection ("C4") configuration. The device-to-interposer/substrate solder interconnects 142 may extend from interconnection pads 114 on an active surface 112 of the microelectronic device 110 and interconnection pads 124 on the microelectronic interposer/substrate first surface 122. The microelectronic device interconnection pads 114 may be in electrical communication with integrated circuitry (not shown) within the microelectronic device 110. The microelectronic interposer/substrate 120 may include at least one conductive route 126 extending therethrough from at least one microelectronic interposer/substrate interconnection pad 124 and at least one microelectronic package interconnection pad 128 on or proximate a second surface 132 of the microelectronic interposer/substrate 120. The microelectronic interposer/substrate 120 may reroute a fine pitch (center-to-center distance between the microelectronic device interconnection pads 114) of the microelectronic device interconnection pads 114 to a relatively wider pitch of the microelectronic package interconnection pads 128.

The microelectronic package 100 may be attached to a microelectronic board/substrate 150, such as printed circuit board, a motherboard, and the like, through a plurality of solder interconnects 144, to form a microelectronic structure 160. The package-to-board/substrate solder interconnects 144 may extend between the microelectronic package interconnection pads 128 and substantially mirror-image interconnection pads 152 on an attachment surface 154 of the microelectronic board/substrate 150. The microelectronic board/substrate interconnection pads 152 may be in electrical communication with conductive routes (shown as dashed lines 156) within the microelectronic board/substrate 150. The microelectronic board/substrate conductive routes 156 may provide electrical communication routes to external components (not shown).

Both the microelectronic interposer/substrate 120 and the microelectronic board/substrate 150 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The microelectronic interposer/substrate conductive routes 126 and the microelectronic board/substrate conductive routes 156 may be composed of any conductive material, including but not limited to metals, such as copper and aluminum, and alloys thereof. As will be understood to those skilled in the art, microelectronic interposer/substrate conductive routes 126 and the microelectronic board/substrate conductive routes 156 may be formed as a plurality of conductive traces (not shown) formed on layers of dielectric material (not shown), which are connected by conductive vias (not shown).

The device-to-interposer/substrate solder interconnects 142 and the package-to-board/substrate solder interconnects 144 can be made of any appropriate solder material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. The solder may be reflowed, either by heat, pressure, and/or sonic energy to secure the solder between the respective interconnections pads, as will be understood to those skilled in the art.

Figure 2:
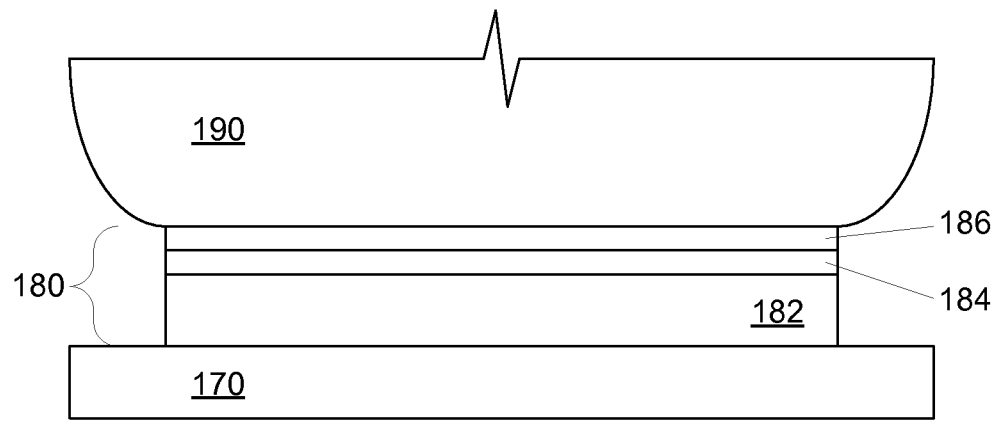
FIG. 2 is a side cross sectional view of an interconnection pad and a solder interconnect with a surface finish structure disposed therebetween, as known in the art.

As shown in FIG. 2 (a close-up of any of the areas labeled A in FIG. 1), an interconnection pad 170 may represent any of the microelectronic device interconnection pads 114, the microelectronic interposer/substrate interconnection pads 124, the microelectronic package interconnection pads 128, and the microelectronic board/substrate interconnection pads 152 of FIG. 1, and a solder interconnect 190 may represent any of the device-to-interposer/substrate solder interconnects 142 and the package-to-board/substrate solder interconnects 144 of FIG. 1. As illustrated, a surface finish structure 180 may be disposed between the interconnection pad 170 and the solder interconnect 190. As known in the art, the surface finish structure 180 may comprise an interlayer 182 (such as a nickel/phosphorus alloys) abutting the interconnection pad 170 (such as a copper-containing metal), a barrier layer 184 (such as palladium-containing material) on the interlayer 182, and an oxidation resistant/solder wetting layer 186 (such as a gold-containing metal) on the barrier layer 184. As will be understood to those skilled in the art, the interlayer 182 is utilized to provide the characteristic of high conductivity for achieving a desired maximum current ($I_{max}$) and to provide the characteristic of ductility for providing sufficient flexibility to absorb any physical shocks to the microelectronic components, such that the joint formed therewith does not crack or break. For such a known surface finish structure 180, the microelectronic package industry generally uses an interlayer 182 comprising a nickel/phosphorus alloy with a 6 to 8% phosphorus content by weight, an palladium-containing barrier layer 184, and a gold oxidation resistant/wetting layer 186, which is used so extensively that is referred to as "universal surface finish". However, the "universal surface finish" is not without issues, as consumption of the interlayer 182 is a significant cause for a decreased maximum current ($I_{max}$) in such surface finish structures 180. As is known in the art, consumption of the interlayer 182 occurs when at least one component of the interlayer 182, such as nickel, diffuses into the solder interconnect 190. Such consumption may be reduced by the barrier layer 184, wherein the barrier layer 184 may also reduce the diffusion of at least one component of the solder interconnect 190, such as tin, which may contaminate the interconnection pad 170. However, such a known surface finish structure 180 cannot meet future maximum current ($I_{max}$) requirements. Although maximum current ($I_{max}$) may be improved by increasing a thickness of the barrier layer 184, such an increase may increase brittleness thereof, which may cause the joint to break, and is, therefore, not a solution. Furthermore, increasing the thickness of the interlayer 182 is also not a solution, as increasing the thickness of the interlayer 182 may cause bridging between adjacent solder interconnects 190, as will be understood to those skilled in the art.

Figure 3:
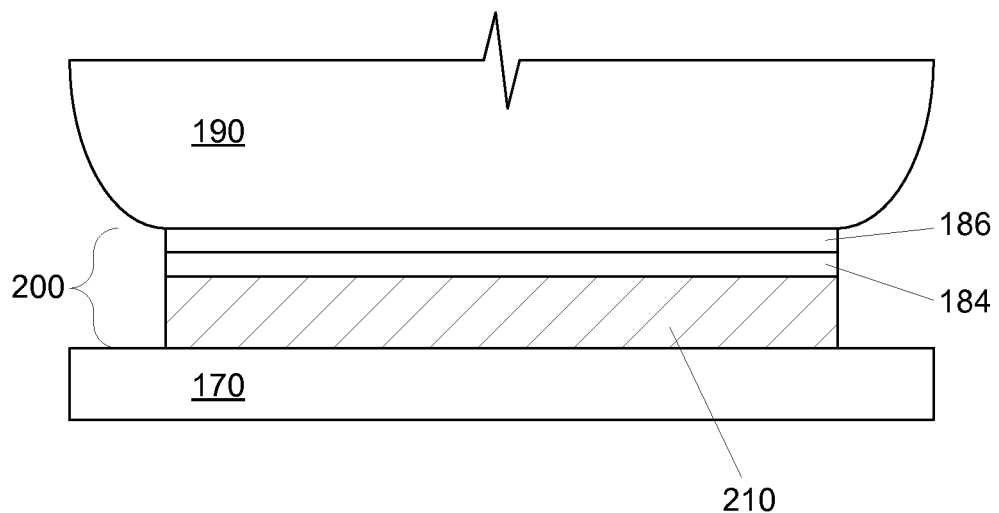
FIG. 3 is a side cross sectional view of an interconnection pad and a solder interconnect with a surface finish structure disposed therebetween, according to an embodiment of the present description.

Embodiments of the present description include an interlayer structure comprising a nickel/phosphorus film that is alloyed with refractory metal in desirable compositional ranges. In one embodiment, the refractory metal may include, but is not limited to, tungsten, molybdenum, and ruthenium. As shown in FIG. 3 (a close-up of any of the areas labeled A in FIG. 1), a surface finish 200 may include an interlayer 210 comprising nickel/phosphorus/refractory metal alloy film formed on the interconnection pad 170. The surface finish 200 may further comprise the barrier layer 184 formed on the interlayer 210, and the oxidation resistant/solder wetting layer 186 formed on the barrier layer 184.

Although materials containing nickel, phosphorus, and refractory metals are known, it has been found that the content of the refractory metal within the interlayer structure controls both joint integrity and thermal endurance (e.g. intermetallic compound growth and layer consumption). It has been found that high refractory metal content leads to better thermal endurance, but also results in poor joint integrity and vice versa. In one embodiment, a refractory metal content of between about 2 and 12% by weight may be used in the interlayer structure 210. Additionally, the content of the refractory metal also dictates the phosphorus content in the interlayer structure to achieve the desired properties of joint integrity and thermal endurance. For a refractory metal content of between about 2 and 12% by weight, a phosphorus content of between about 2 and 12% by weight with the remainder being nickel may be used in the interlayer structure 210. The appropriate range of the content of the refractory metal relative to the range of content of phosphorus balance was achieved due to the discovery that a higher content of the refractory metal reduces the content of phosphorus, and vice versa, to achieve the desirable properties of joint integrity and thermal endurance.

In one embodiment, the refractory metal may comprises tungsten, wherein the interlayer 210 may comprise a tungsten content of between about 2 and 6% by weight and a phosphorus content of between about 3 and 6% by weight, with the remainder being nickel. In a specific embodiment, the interlayer 210 may comprise a tungsten content of between about 5 and 6% by weight and a phosphorus content of between about 5 and 6% by weight, with the remainder being nickel (hereinafter referred to the "specific embodiment").

Standard Imax testing performed using the interlayer 210 having a tungsten content of between about 5 and 6% by weight and a phosphorus content of between about 5 and 6% by weight, with remainder being nickel is about twice that of the known interlayer having a phosphorus content of between about 6 and 8% by weight, with remainder being nickel. Thus, the interlayer 210 of present description improves electromigration resistance of the surface finish 200 and can replace known nickel/phosphorus layer structures without any degradation in the integrity of the solder joint, but with a higher maximum current capability.

It is understood that the embodiment of the present description may provide stronger electro-migration resistance, superior corrosion resistance, higher thermal endurance, and comparable resistivity compared with the current surface finishes, and can be implemented with minimal disruption in the process flow in the production of microelectronic devices. It is further understood that the embodiments of the present description may allow for tailoring/tuning of the desired properties by varying the refractory metal and phosphorus compositions through appropriate doping levels and/or adjusting the thickness of the interlayer 210 that may make it possible to achieve a desired combination of properties for both high and low power applications, which is not possible with currently known nickel/phosphorus film based surface finishes.

The interconnection pad 170 may be made from any appropriate conductive materials, such as metals. In one embodiment, the interconnection pad 170 comprises copper. The solder interconnect 190 may be made of any appropriate solder material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys.

The barrier layer 184 may be any material which resists diffusion of at least one component of the interlayer 210 into the solder interconnect 190 and resists diffusion of at least one component of the solder interconnect 190, such as tin, toward the interconnection pad 170. In one embodiment, the barrier layer 184 may comprise a palladium-containing material. The oxidation resistant/solder wetting layer 186 may be any appropriate conductive material that will reduce oxidation of the barrier layer 184 and/or the interlayer structure 210. In one embodiment, the oxidation resistant/solder wetting layer 186 comprises gold.

Figure 4:
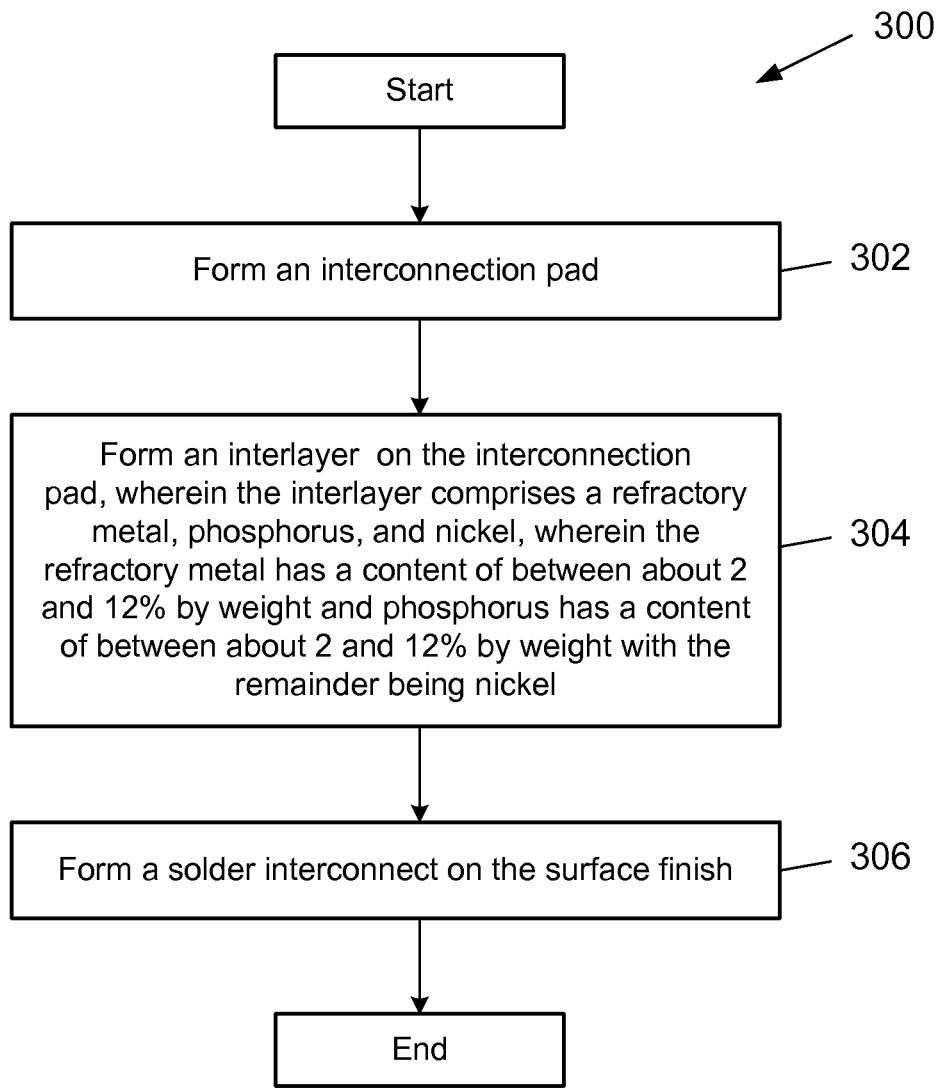
FIG. 4 is a flow chart of a process of fabricating a microelectronic package, according to an embodiment of the present description.

FIG. 4 is a flow chart of a process 300 of fabricating a microelectronic structure according to an embodiment of the present description. As set forth in block 302, an interconnection pad may be formed. An interlayer may be formed on the interconnection pad, wherein the interlayer comprises a refractory metal, phosphorus and nickel, wherein the refractory metal has a content of between about 2 and 12% by weight and phosphorus has a content of between about 2 and 12% by weight with the remainder being nickel, as set forth in block 304. As set forth in block 306, a solder interconnect formed on the interlayer.

Figure 5:
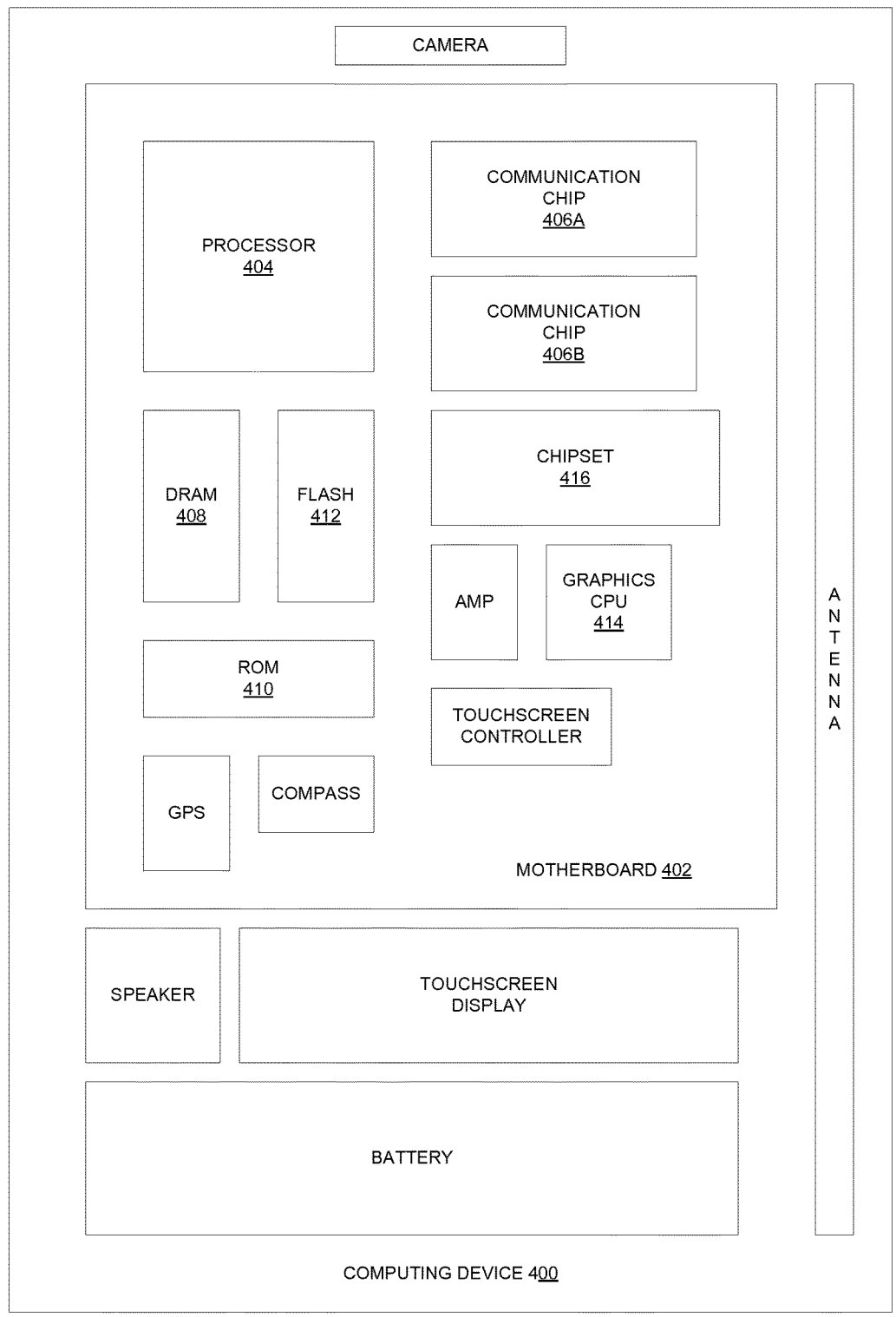
FIG. 5 illustrates a computing device in accordance with one implementation of the present description.

FIG. 5 illustrates a computing device 400 in accordance with one implementation of the present description. The computing device 400 houses a board 402. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a surface finish on a interconnection pad, wherein the surface finish includes an interlayer on the interconnection pad, wherein the interlayer comprises a refractory metal, phosphorus, and nickel, wherein the refractory metal has a content of between about 2 and 12% by weight and the phosphorus has a content of between about 2 and 12% by weight with the remainder being nickel, as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-5. The subject matter may be applied to other microelectronic device and assembly applications, as will be understood to those skilled in the art.

The following examples pertain to further embodiments, wherein Example 1 is a microelectronic structure, comprising an interconnection pad; an interlayer on the interconnection pad, wherein the interlayer comprises a refractory metal, phosphorus, and nickel, wherein the refractory metal has a content of between about 2 and 12% by weight and the phosphorus has a content of between about 2 and 12% by weight with the remainder being nickel; and a solder interconnect on the interlayer.

In Example 2, the subject matter of Example 1 can optionally include the refractory metal selected from the group consisting of tungsten, molybdenum, and ruthenium.

In Example 3, the subject matter of Example 1 can optionally include the refractory metal comprising tungsten having a content of between about 2 and 6% by weight and wherein the phosphorus has a content of between about 3 and 6% by weight.

In Example 4, the subject matter of Example 1 can optionally include the refractory metal comprising tungsten having a content of between about 5 and 6% by weight and wherein the phosphorus has a content of between about 5 and 6% by weight.

In Example 5, the subject matter of any one of Examples 1 to 4 can optionally include a barrier layer disposed between the interlayer and the solder interconnect.

In Example 6, the subject matter of Example 5 can optionally include the barrier layer comprising a palladium-containing material.

In Example 7, the subject matter of any one of Examples 1 to 4 can optionally include an oxidation resistant/solder wetting layer disposed between the interlayer and the solder interconnect.

In Example 8, the subject matter of Example 7 can optionally include the oxidation resistant/solder wetting layer comprising gold.

The following examples pertain to further embodiments, wherein Example 9 is a method of fabricating a microelectronic structure, comprising: forming an interconnection pad; forming an interlayer on the interconnection pad, wherein the interlayer comprises a refractory metal, phosphorus, and nickel, wherein the refractory metal has a content of between about 2 and 12% by weight and the phosphorus has a content of between about 2 and 12% by weight with the remainder being nickel; and forming a solder interconnect on the interlayer.

In Example 10, the subject matter of Example 9 can optionally include forming the interlayer on the interconnection pad comprising forming the interlayer on the interconnection pad, wherein the refractory metal is selected form one of the group consisting of tungsten, molybdenum, and ruthenium.

In Example 11, the subject matter of Example 9 can optionally include forming the interlayer on the interconnection pad, wherein the interlayer comprises tungsten having a content of between about 2 and 6% by weight and the phosphorus having a content of between about 3 and 6% by weight with the remainder being nickel.

In Example 12, the subject matter of Example 9 can optionally include forming the interlayer on the interconnection pad, wherein the interlayer comprises tungsten having a content of between about 5 and 6% by weight and the phosphorus having a content of between about 5 and 6% by weight with the remainder being nickel.

In Example 13, the subject matter of any one of Examples 9 to 12 can optionally include forming a barrier layer between the interlayer and the solder interconnect.

In Example 14, the subject matter of Example 13 can optionally include forming the barrier layer comprising forming a palladium-containing barrier layer.

In Example 15, the subject matter of any one of Examples 9 to 12 can optionally include forming an oxidation resistant/solder wetting layer between the interlayer and the solder interconnect.

In Example 16, the subject matter of Example 15 can optionally include forming the oxidation resistant/solder wetting layer comprising forming a gold oxidation resistant/solder wetting layer.

The following examples pertain to further embodiments, wherein Example 17 is an electronic system, comprising a board; and a microelectronic package attached to the board, wherein at least one of the microelectronic package and the board includes an interconnection pad, wherein the interlayer comprises a refractory metal, phosphorus, and nickel, wherein the refractory metal has a content of between about 2 and 12% by weight and the phosphorus has a content of between about 2 and 12% by weight with the remainder being nickel; and a solder interconnect on the interlayer.

In Example 18, the subject matter of Example 17 can optionally include the refractory metal selected from the group consisting of tungsten, molybdenum, and ruthenium.

In Example 19, the subject matter of Example 17 can optionally include the refractory metal comprising tungsten having a content of between about 2 and 6% by weight and wherein the phosphorus has a content of between about 3 and 6% by weight.

In Example 20, the subject matter of Example 17 can optionally include the refractory metal comprising tungsten having a content of between about 5 and 6% by weight and wherein the phosphorus has a content of between about 5 and 6% by weight.

In Example 21, the subject matter of any one of Examples 17 to 20 can optionally include a barrier layer disposed between the interlayer and the solder interconnect.

In Example 22, the subject matter of Example 21 can optionally include the barrier layer comprising a palladium-containing material.

In Example 23, the subject matter of any one of Examples 17 to 20 can optionally include an oxidation resistant/solder wetting layer disposed between the interlayer and the solder interconnect.

In Example 24, the subject matter of Example 23 can optionally include the oxidation resistant/solder wetting layer comprising gold.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
an interconnection pad;
an interlayer on the interconnection pad, wherein the interlayer comprises a refractory metal, phosphorus, and nickel, wherein the refractory metal has a content of between about 2 and 12% by weight and the phosphorus has a content of between about 2 and 12% by weight with the remainder being nickel, and wherein the refractory metal is selected from the group consisting of molybdenum and ruthenium; and
a solder interconnect on the interlayer.

2. The microelectronic structure of claim 1, further including a barrier layer disposed between the interlayer and the solder interconnect.

3. The microelectronic structure of claim 2, wherein the barrier layer comprises a palladium-containing material.

4. The microelectronic structure of claim 1, further including an oxidation resistant/solder wetting layer disposed between the interlayer and the solder interconnect.

5. The microelectronic structure of claim 4, wherein the oxidation resistant/solder wetting layer comprises gold.

6. A method for fabricating a microelectronic structure, comprising:
forming an interconnection pad;
forming an interlayer on the interconnection pad, wherein the interlayer comprises a refractory metal, phosphorus, and nickel, wherein the refractory metal has a content of between about 2 and 12% by weight and the phosphorus has a content of between about 2 and 12% by weight with the remainder being nickel, and wherein the refractory metal is selected from the group consisting of molybdenum and ruthenium; and
forming a solder interconnect on the interlayer.

7. The method of claim 6, further including forming a barrier layer between the interlayer and the solder interconnect.

8. The method of claim 7, wherein forming the barrier layer comprises forming a palladium-containing barrier layer.

9. The method of claim 6, further including forming an oxidation resistant/solder wetting layer between the interlayer and the solder interconnect.

10. The method of claim 9, wherein forming the oxidation resistant/solder wetting layer comprises forming a gold oxidation resistant/solder wetting layer.

11. An electronic system, comprising:
a board; and
a microelectronic package attached to the board, wherein at least one of the microelectronic package and the board includes:
an interconnection pad;
an interlayer on the interconnection pad, wherein the interlayer comprises a refractory metal, phosphorus, and nickel, wherein the refractory metal has a content of between about 2 and 12% by weight and the phosphorus has a content of between about 2 and 12% by weight with the remainder being nickel, and wherein the refractory metal is selected from the group consisting of molybdenum and ruthenium; and
a solder interconnect on the interlayer.

12. The electronic system of claim 11, further including a barrier layer disposed between the interlayer and the solder interconnect.

13. The electronic system of claim 12, wherein the barrier layer comprises a palladium-containing material.

14. The electronic system of claim 11, further including an oxidation resistant/solder wetting layer disposed between the interlayer and the solder interconnect.

15. The electronic system of claim 14, wherein the oxidation resistant/solder wetting layer comprises gold.

* * * * *